United States Patent [19]

Baro

[11] 3,896,394

[45] July 22, 1975

[54] ARRANGEMENT FOR COMPENSATING THE TEMPERATURE DRIFT OF A POWER AMPLIFIER

[75] Inventor: Jose Marie Baro, Paris, France

[73] Assignee: Thomson-CSF, Paris, France

[22] Filed: Sept. 20, 1974

[21] Appl. No.: 507,996

[30] Foreign Application Priority Data

Sept. 25, 1973 France .............................. 73.34297

[52] U.S. Cl. ..................... 330/23; 330/38 M; 330/40

[51] Int. Cl.[2] ............................................ H03F 3/04

[58] Field of Search ........ 330/22, 23, 38 M, 40, 146

[56] References Cited

UNITED STATES PATENTS 3,651,346 2/1975 Limberg ............................ 330/22 X

*Primary Examiner*—James B. Mullins

*Attorney, Agent, or Firm*—Cushman, Darby and Cushman

[57] ABSTRACT

A bias arrangement makes it possible to automatically compensate the temperature drift occuring in an amplifier transistor. The bias arrangement formed by a first and a second transistor, supplies the bias voltage for an amplifier transistor, which voltage is variable by a variable resistor in the emitter lead of the first transistor. A third transistor identical to the first transistor assembled on the same radiator as the first transistor and the amplifier transistor supplies to the base of the amplifier transistor a voltage proportional to the temperature variations, with a coefficient which is chosen by means of a resistance bridge, in order to precisely compensate the variations the amplifier transistor.

3 Claims, 1 Drawing Figure

PATENTED JUL 22 1975 3,896,394
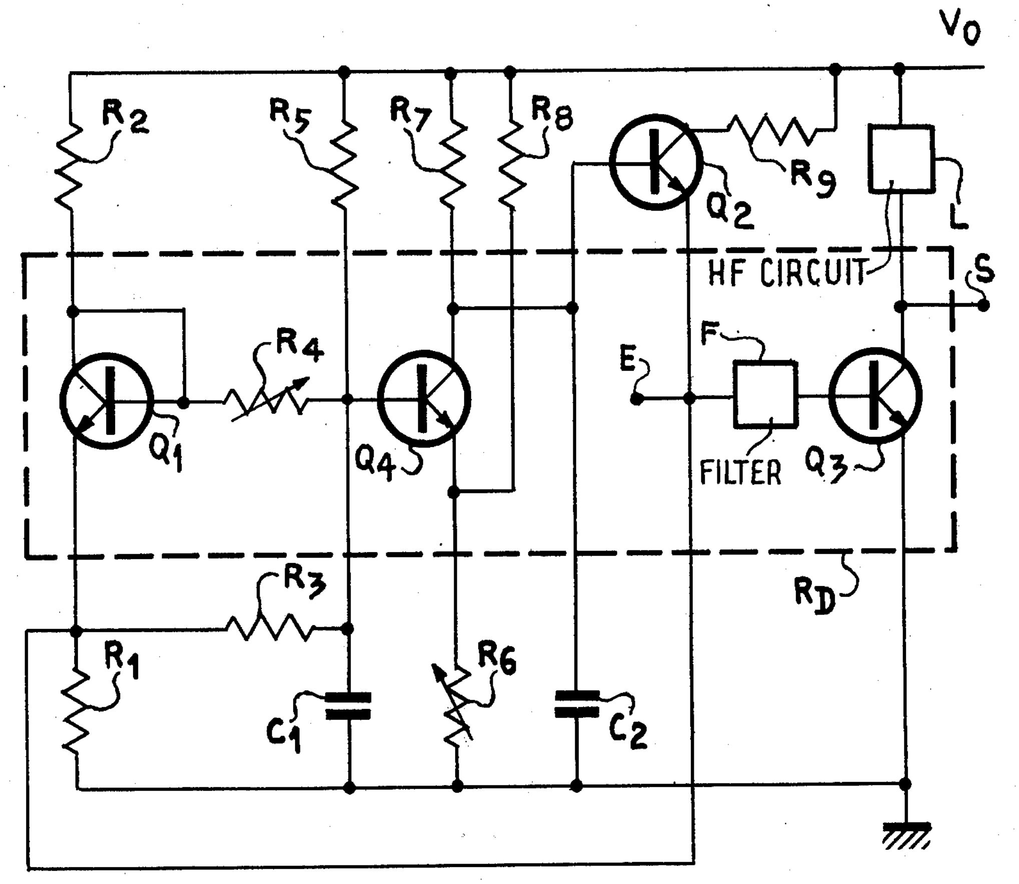

ARRANGEMENT FOR COMPENSATING THE TEMPERATURE DRIFT OF A POWER AMPLIFIER

The present invention relates to transistor power amplifiers provided with an arrangement for compensating the temperature drift of the power amplifier transistor.

A circuit of this type has been described in French Pat. No. 2,105,557 using regulation transistor which enables the bias voltage of the amplifier transistor to follow a variation which compensates for that produced by the temperature variation. But amplifiers of this type have the drawback that they require an external element, diode or transistor, the temperature drift of which must be the same as that of the power amplifier transistor; in addition they do not comprise any adjusting means.

The present invention makes it possible to overcome this drawbacks.

According to the invention there is provided a power amplifier comprising at least one amplifier transistor having a base, an emitter and a collector, said amplifier transistor for amplifying an input signal being arranged in a common emitter configuration at least as far as the bias is concerned and an arrangement for supplying a bias voltage to the base of said amplifier transistor, said arrangement including: an auxiliary transistor having a base, a collector and an emitter, the emitter of said auxiliary transistor being coupled to the base of said amplifier transistor; a regulating transistor having a base, a collector and an emitter, the collector of said regulating transistor being coupled to the base of said auxiliary transistor; a resistor inserted between the base of said regulating transistor and the emitter of said auxiliary transistor; a further transistor, having the same characteristics as said regulating transistor and having a base, a collector and an emitter, the emitter of said further transistor being coupled to the emitter of said auxiliary transistor; a variable resistor inserted between the base of said regulating transistor and the base of said further transistor, the base and collector of said further transistor being coupled; and means for adjusting the emitter voltage of said regulating transistor; said amplifier transistor, said regulating transistor and said further transistor being assembled on one and the same radiator.

The invention will be better understood and other of its features rendered apparent, from a consideration of the ensuing description given with reference to the appended drawing which represents an embodiment of a transistor amplifier in accordance with the invention.

In this drawing, an NPN transistor $Q_3$ is a power amplifier transistor connected in a common emitter configuration and the collector of which is connected to a direct supply voltage source $V_0$ through a high frequency circuit L. The base of the transistor $Q_3$ is connected to the output of a bias arrangement through a filter circuit F passing the direct current straight through. This output formed the input E of the amplifier, the output S of the amplifier being formed by the collector of $Q_3$. The transistor $Q_3$ is mounted on a radiator RD. The arrangement for biasing the transistor $Q_3$ comprises the following elements:

A transistor $Q_2$ connected as a current amplifier, is connected by its collector to the voltage source $V_0$ through a resistor $R_9$ and by its emitter to the input E. The base of the transistor $Q_2$ is connected to ground through a capacitor $C_2$ and to the collector of a transistor $Q_4$.

The transistor $Q_4$ and another transistor $Q_1$ are also assembled on the radiator RD as close as possible to $Q_3$.

These transistors $Q_1$ and $Q_4$ have the same substrate. Their characteristics are therefore identical, by construction. The base and the collector of $Q_1$ are connected on the one hand to the direct supply voltage source $V_0$ through a resistor $R_2$, and on the other hand to the base of the transistor $Q_4$ through a variable resistor $R_4$.

The emitter of the transistor $Q_1$ is connected to the input E on the one hand and to ground through a resistor $R_1$ on the other.

The collector of the transistor $Q_4$ is connected to the base of $Q_2$ as described earlier and to the direct voltage source $V_0$ through a resistor $R_7$. The base of $Q_4$ is connected to the direct voltage source $V_0$ through a resistor $R_5$, grounded through a capacitor $C_1$ and connected to the resistor $R_3$ as described earlier.

The emitter of $Q_4$ is connected to two resistor, one $R_8$ is connected to the direct voltage source $V_0$, while the other $R_6$ being a variable resistor, is grounded.

The operation of the arrangement at a given fixed temperature, corresponds with that of a stabilised supply: an amplifier circuit compares the output voltage with a reference voltage to ensure that the output voltage is the same.

The reference voltage $V_R$ is the emitter voltage of the transistor $Q_4$ and is fixed by means of the variable resistor $R_6$. The bias voltage at the point E is $V_E$; $V_B$ is the voltage drop across the terminals of the resistor $R_3$, $V_{BE}$ is the voltage drop between base and emitter of $Q_4$ for a given collector current, $V_D$ being that of $Q_1$ which is connected as a diode.

This gives the relationship:

$$V_E + V_B - V_{BE} = V_R.$$

The resistors have resistances such that at said given temperature $V_B = V_{BE}$.

Accordingly $V_R = V_E$; the bias voltage $V_E$ is equal to the reference voltage.

The transistors $Q_1$ and $Q_4$ are identical; accordingly, the resistors $R_2$ and $R_7$ can be so chosen that the voltages $V_D$ and $V_{BE}$ are equal whatever the temperature. The temperature drift of these voltages is of the order of $k = -2\text{m V}/^0\text{C}$.

If the temperature of the base-emitter junctions changes because of variations in external conditions, or because of the transfer of a heat quantity through the radiator RD due to $Q_3$, then $V_D$ changes to $V_D + \Delta V_D$ and $V_{BE}$ changes to $V_{BE} + \Delta V_{BE}$, $\Delta V_B = \Delta V_{BE} = (k)(\Delta T)$, where $\Delta T$ is the temperature variation experienced by these junctions.

The voltage $V_B$ therefore changes in association with the variations in $V_D$, because of the presence of the voltage divider $R_3$ and $R_4$, to:

$$V_B + \Delta V_B = V_B + (\Delta V_D.)\frac{R_3}{R_4 + R_3} = V_B + (k)(\Delta T)\frac{R_3}{R_4 + R_3}$$

The bias voltage $V_E$ will therefore vary as a function of the temperature and as a function of the resistance of the variable resistor $R_4$, in accordance with the relationship $$\Delta V_E = (k) \quad 1 - \frac{R_3}{R_4 + R_3} \quad (\Delta T) = (k')\,(\Delta T)$$

$$\text{where } k' = (k) \quad 1 - \frac{R_3}{R_4 + R_3}$$

Thus, the bias voltage $V_E$ varies linearly as a function of temperature.

The resistances of the resistors $R_3$ and $R_4$ as well as the setting of $R_4$ can be chosen so that $k'$ is equal to the drift factor of the amplifier transistor $Q_3$. In this way, a collector current is obtained which is independent of temperature.

In addition, the method of adjusting $R_6$ and $R_4$ is very simple: At a given temperature, the adjustment of $R_6$ makes it possible to set the voltage $V_E$ to the value required to obtain the desired current in the amplifier transistor $Q_3$.

Subsequently, the radiator which is common to the three transistors is placed at a different temperature and $R_4$ is adjusted in order to restore the chosen current in $Q_3$. The adjustment thus obtained is valid throughout the operating temperature range.

Moreover, the bias voltage $V_E$ is relatively independent of the circuit supply voltage $V_0$ since the current in $R_2$ and $R_3$ varies proportionally with the reference voltage $V_R$ which is obtained by division of $V_0$.

The output impedance of the device is very low and substantially equal to: $(1/\beta Gm)$ where $\beta$ is the current gain of the transistor $Q_2$ and $Gm$ the slope of the voltage-current characteristic of $Q_4$.

The invention is not limited to the embodiment described and illustrated.

In particular, the transistor $Q_2$ can be connected to one or several supplementary transistors with the object of achieving a higher current gain. In addition, the amplifier may comprise supplementary capacitors designed to prevent oscillation and to eliminate the high frequency coming from the circuits of $Q_3$.

On the other hand, the transistor $Q_2$ has been shown outside the radiator $R_D$ although it could, without any drawback, be assembled on the radiator.

Finally, the power amplifier may comprise several power amplifier transistors having identical characteristics, in particular for symmetrical class B power amplifier circuits, receiving the same bias voltage.

Of course, the invention is not limited to the embodiments described and shown which were given solely by way of example.

What is claimed is:

1. A power amplifier comprising at least one amplifier transistor having a base, an emitter and a collector, said amplifier transistor for amplifying an input signal being arranged in a common emitter configuration at least as far as the bias is concerned and an arrangement for supplying a bias voltage to the base of said amplifier transistor, said arrangement including: an auxiliary transistor having a base, a collector and an emitter, the emitter of said auxiliary transistor being coupled to the base of said amplifier transistor; a regulating transistor having a base, a collector and an emitter, the collector of said regulating transistor being coupled to the base of said auxiliary transistor; a resistor inserted between the base of said regulating transistor and the emitter of said auxiliary transistor; a further transistor, having the same characteristics as said regulating transistor and having a base, a collector and an emitter, the emitter of said further transistor being coupled to the emitter of said auxiliary transistor; a variable resistor inserted between the base of said regulating transistor and the base of said further transistor, the base and collector of said further transistor being coupled; and means for adjusting the emitter voltage of said regulating transistor; said amplifier transistor, said regulating transistor and said further transistor being assembled on one and the same radiator.

2. A power amplifier as claimed in claim 1 wherein said regulating transistor and said further transistor have a common substrate.

3. A power amplifier as claimed in claim 2 wherein said auxiliary transistor is assembled on said radiator.

* * * * *